(12) United States Patent
Hirata et al.

(10) Patent No.: US 10,081,076 B2
(45) Date of Patent: Sep. 25, 2018

(54) WAFER PRODUCING METHOD

(71) Applicant: DISCO CORPORATION, Tokyo (JP)

(72) Inventors: Kazuya Hirata, Tokyo (JP); Yoko Nishino, Tokyo (JP); Tomoki Yoshino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 210 days.

(21) Appl. No.: 15/088,441

(22) Filed: Apr. 1, 2016

(65) Prior Publication Data
US 2016/0288251 A1 Oct. 6, 2016

(30) Foreign Application Priority Data

Apr. 6, 2015 (JP) ................. 2015-078029

(51) Int. Cl.
*B23K 26/00* (2014.01)
*B23K 26/53* (2014.01)
(Continued)

(52) U.S. Cl.
CPC ...... *B23K 26/0057* (2013.01); *B23K 26/0006* (2013.01); *B23K 26/032* (2013.01); *B23K 26/046* (2013.01); *B23K 26/0622* (2015.10); *B23K 26/082* (2015.10); *B23K 26/0823* (2013.01); *B23K 26/0853* (2013.01); *B23K 26/38* (2013.01); *B23K 26/53* (2015.10); *B23K 26/702* (2015.10); *B23K 37/00* (2013.01);
(Continued)

(58) Field of Classification Search
USPC .................................. 438/460–465
See application file for complete search history.

(56) References Cited

U.S. PATENT DOCUMENTS 5,223,692 A 6/1993 Lozier et al.
5,561,544 A 10/1996 Macken
(Continued)

FOREIGN PATENT DOCUMENTS

JP 2000-094221 4/2000
JP 2002373870 A 12/2002
(Continued)

OTHER PUBLICATIONS

U.S. Appl. No. 14/955,352, filed Dec. 1, 2015.
(Continued)

*Primary Examiner* — Jason Daniel Prone
*Assistant Examiner* — Richard Crosby, Jr.
(74) *Attorney, Agent, or Firm* — Greer Burns & Crain, Ltd.

(57) ABSTRACT

A wafer is produced from an ingot having an end surface. The method includes an end surface measuring step of measuring undulation present on the end surface, and a separation plane forming step of setting the focal point of a laser beam inside the ingot at a predetermined depth from the end surface, which depth corresponds to the thickness of the wafer to be produced, and next applying the laser beam to the end surface to thereby form a separation plane containing a modified layer and cracks extending from the modified layer. The height of an objective lens for forming the focal point of the laser beam is controlled so that the focal point is set in the same plane to form the separation plane, according to the numerical aperture NA of the lens, the refractive index N of the ingot, and the undulation present on the end surface.

3 Claims, 15 Drawing Sheets

(51) Int. Cl.

| | | |
|---|---|---|
| *B23K 26/03* | (2006.01) | |
| *B28D 5/00* | (2006.01) | |
| *B23K 37/00* | (2006.01) | |
| *B23K 26/046* | (2014.01) | |
| *B23K 26/08* | (2014.01) | |
| *B23K 26/38* | (2014.01) | |
| *C30B 29/36* | (2006.01) | |
| *C30B 29/40* | (2006.01) | |
| *C30B 33/06* | (2006.01) | |
| *B23K 26/70* | (2014.01) | |
| *B23K 26/082* | (2014.01) | |
| *B23K 26/0622* | (2014.01) | |
| *B23K 103/00* | (2006.01) | |
| *B23K 101/40* | (2006.01) | |

(52) U.S. Cl.
CPC ............ *B28D 5/0011* (2013.01); *C30B 29/36* (2013.01); *C30B 29/406* (2013.01); *C30B 33/06* (2013.01); *B23K 2201/40* (2013.01); *B23K 2203/56* (2015.10)

(56) References Cited

U.S. PATENT DOCUMENTS

| | | | |
|---|---|---|---|
| 5,581,572 | A | 12/1996 | Delorme et al. |
| 5,912,186 | A | 6/1999 | Yoshino et al. |
| 6,720,522 | B2 | 4/2004 | Ikegami et al. |
| 7,374,955 | B2 | 5/2008 | Izumome |
| 7,566,635 | B2 | 7/2009 | Fujii et al. |
| 7,737,001 | B2 | 6/2010 | Abe et al. |
| 7,892,949 | B2 * | 2/2011 | Abe .................. B23K 26/0057 438/462 |
| 8,148,184 | B2 | 4/2012 | Koyanagi et al. |
| 8,263,479 | B2 * | 9/2012 | Fukuyo .............. B23K 26/0057 257/E21.237 |
| 8,415,234 | B2 | 4/2013 | Abatake |
| 8,722,516 | B2 | 5/2014 | Yamada et al. |
| 8,790,997 | B2 | 7/2014 | Nakagawa et al. |
| 9,138,913 | B2 * | 9/2015 | Arai ..................... B28D 5/00 |
| 9,174,305 | B2 | 11/2015 | Morikazu et al. |
| 9,193,008 | B2 | 11/2015 | Morikazu et al. |
| 9,478,696 | B2 | 10/2016 | Tajikara et al. |
| 9,481,051 | B2 | 11/2016 | Hirata et al. |
| 9,488,831 | B2 * | 11/2016 | Ito ....................... B23K 26/032 |
| 9,517,530 | B2 | 12/2016 | Hirata et al. |
| 9,620,415 | B2 | 4/2017 | Hirata et al. |
| 9,757,815 | B2 * | 9/2017 | Hosseini ........... B23K 26/0648 |
| 9,850,160 | B2 * | 12/2017 | Marjanovic ......... C03B 33/0215 |
| 9,878,397 | B2 * | 1/2018 | Hirata ................ B23K 37/0235 |
| 2003/0141505 | A1 | 7/2003 | Isobe et al. |
| 2004/0002199 | A1 | 1/2004 | Fukuyo et al. |
| 2004/0144301 | A1 | 7/2004 | Neudeck et al. |
| 2005/0199592 | A1 | 9/2005 | Iri et al. |
| 2005/0217560 | A1 | 10/2005 | Tolchinsky et al. |
| 2006/0079155 | A1 | 4/2006 | Nakamura et al. |
| 2006/0258047 | A1 * | 11/2006 | Nishiwaki .......... B23K 26/0057 438/107 |
| 2007/0111480 | A1 * | 5/2007 | Maruyama ......... B23K 26/0057 438/463 |
| 2007/0284764 | A1 | 12/2007 | Sekiya |
| 2008/0008641 | A1 | 1/2008 | Leonard et al. |
| 2008/0070380 | A1 | 3/2008 | Kusunoki |
| 2009/0117712 | A1 | 5/2009 | Sakamoto et al. |
| 2009/0127233 | A1 | 5/2009 | Asano et al. |
| 2009/0320897 | A1 | 12/2009 | Shimomura |
| 2010/0203706 | A1 | 8/2010 | Ohnuma et al. |
| 2011/0193269 | A1 | 8/2011 | Ito et al. |
| 2011/0195536 | A1 | 8/2011 | Koyanagi et al. |
| 2011/0195537 | A1 | 8/2011 | Koyanagi et al. |
| 2011/0298084 | A1 | 12/2011 | Tamemoto |
| 2012/0055546 | A1 | 3/2012 | Turner |
| 2012/0111495 | A1 | 5/2012 | Shimoi et al. |
| 2012/0289028 | A1 | 11/2012 | Abatake |
| 2012/0298636 | A1 | 11/2012 | Nomaru et al. |
| 2013/0248500 | A1 | 9/2013 | Shreter et al. |
| 2015/0121960 | A1 | 5/2015 | Hosseini |
| 2015/0376813 | A1 | 12/2015 | Tsuchida et al. |
| 2016/0052090 | A1 | 2/2016 | Tanigawa |
| 2016/0093763 | A1 | 3/2016 | Rana et al. |
| 2016/0158881 | A1 | 6/2016 | Hirata et al. |
| 2016/0163549 | A1 | 6/2016 | Okuma et al. |
| 2016/0228984 | A1 | 8/2016 | Hirata et al. |
| 2016/0293397 | A1 | 10/2016 | Hirata et al. |
| 2016/0354862 | A1 | 12/2016 | Hirata et al. |
| 2016/0354863 | A1 | 12/2016 | Hirata |
| 2017/0015017 | A1 | 1/2017 | Hirata |
| 2017/0053829 | A1 | 2/2017 | Hirata et al. |

FOREIGN PATENT DOCUMENTS

| | | |
|---|---|---|
| JP | 2007019379 A | 1/2007 |
| JP | 2013-049161 | 3/2013 |

OTHER PUBLICATIONS

U.S. Appl. No. 14/955,306, filed Dec. 1, 2015.
U.S. Appl. No. 14/953,718, filed Nov. 30, 2015.
U.S. Appl. No. 14/953,679, filed Nov. 30, 2015.
U.S. Appl. No. 14/988,310, filed Jan. 5, 2016.
U.S. Appl. No. 14/988,378, filed Jan. 5, 2016.
U.S. Appl. No. 15/015,852, filed Feb. 4, 2016.
U.S. Appl. No. 15/014,367, filed Feb. 3, 2016.
U.S. Appl. No. 15/015,532, filed Feb. 4, 2016.
U.S. Appl. No. 15/088,386, filed Apr. 1, 2016.
U.S. Appl. No. 15/083,635, filed Mar. 29, 2016.
U.S. Appl. No. 15/165,259, filed May 26, 2016.
U.S. Appl. No. 15/165,686, filed May 26, 2016.
U.S. Appl. No. 15/205,644, filed Jul. 8, 2016.
U.S. Appl. No. 15/206,292, filed Jul. 13, 2016.
U.S. Appl. No. 15/212,513, filed Jul. 18, 2016.

* cited by examiner

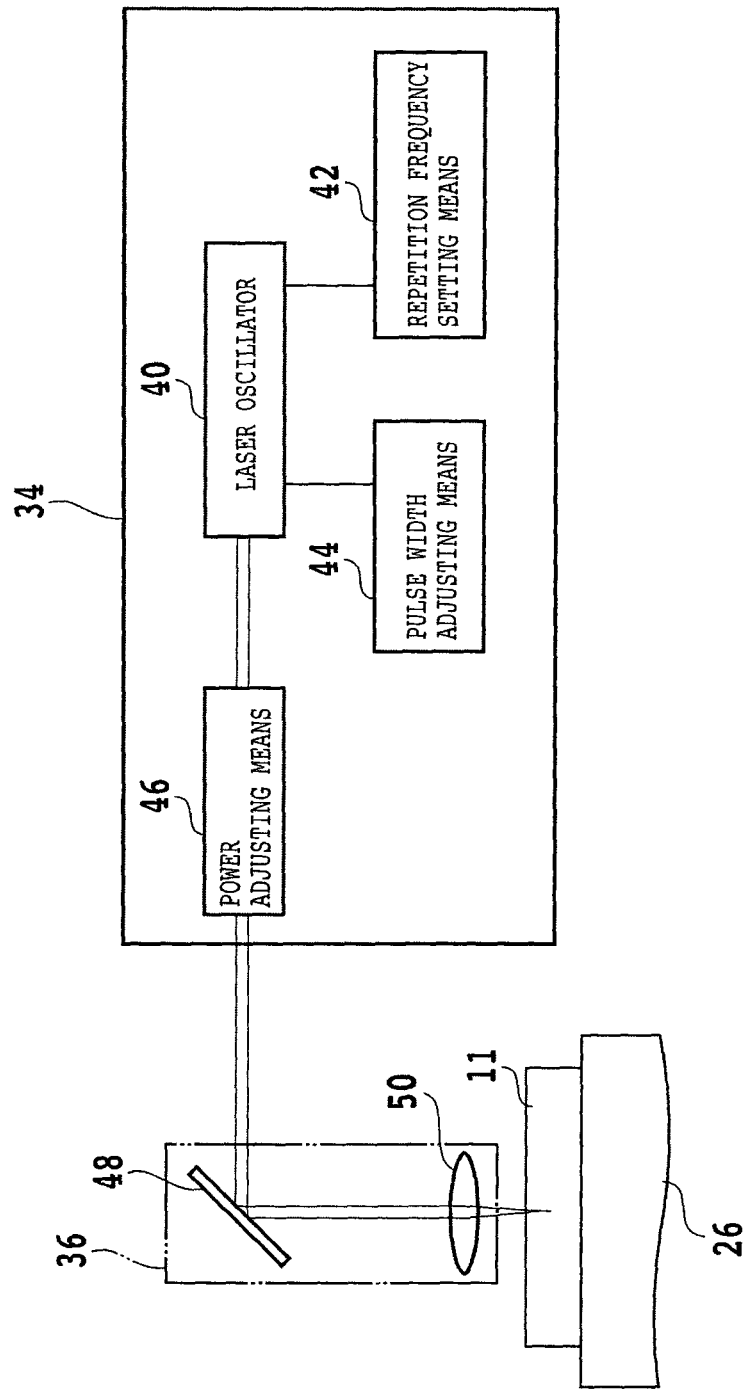

FIG.6
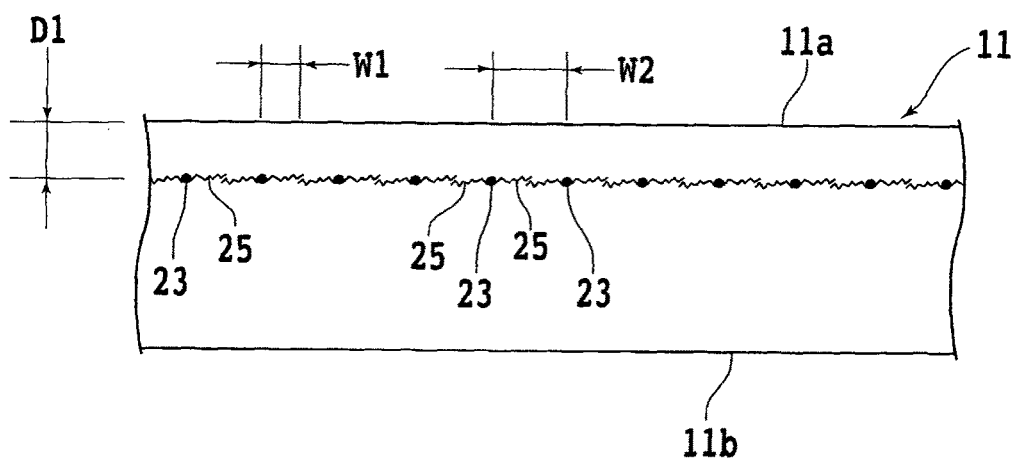
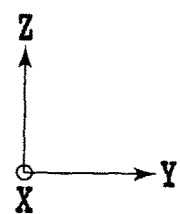

FIG.11

| | | | | | |
|---|---|---|---|---|---|
| $y_1$ | $(x_1, z_1)$ | $(x_{1-1}, z_{1-1})$ | $(x_{1-2}, z_{1-2})$ | ......... | $(x_{1-n}, z_{1-n})$ |
| $y_2$ | $(x_2, z_2)$ | $(x_{2-1}, z_{2-1})$ | $(x_{2-2}, z_{2-2})$ | ......... | $(x_{2-n}, z_{2-n})$ |
| $y_3$ | $(x_3, z_3)$ | $(x_{3-1}, z_{3-1})$ | $(x_{3-2}, z_{3-2})$ | ......... | $(x_{3-n}, z_{3-n})$ |
| $y_4$ | $(x_4, z_4)$ | $(x_{4-1}, z_{4-1})$ | $(x_{4-2}, z_{4-2})$ | ......... | $(x_{4-n}, z_{4-n})$ |
| $y_5$ | $(x_5, z_5)$ | $(x_{5-1}, z_{5-1})$ | $(x_{5-2}, z_{5-2})$ | ......... | $(x_{5-n}, z_{5-n})$ |
| $y_{m-1}$ | $(x_{m-1}, z_{m-1})$ | $(x_{m-1-1}, z_{m-1-1})$ | | ......... | $(x_{m-1-n}, z_{m-1-n})$ |
| $y_m$ | $(x_m, z_m)$ | $(x_{m-1}, z_{m-1})$ | | ......... | $(x_{m-n}, z_{m-n})$ |

WAFER PRODUCING METHOD

BACKGROUND OF THE INVENTION

Field of the Invention

The present invention relates to a wafer producing method for slicing a hexagonal single crystal ingot to produce a wafer.

Description of the Related Art

Various devices such as ICs and LSIs are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips corresponding to the respective devices. The device chips thus obtained are widely used in various equipment such as mobile phones and personal computers. Further, power devices or optical devices such as LEDs and LDs are formed by forming a functional layer on the front side of a wafer formed of a hexagonal single crystal such as SiC and GaN and partitioning this functional layer into a plurality of regions along a plurality of crossing division lines.

In general, the wafer on which the devices are to be formed is produced by slicing an ingot with a wire saw. Both sides of the wafer obtained above are polished to a mirror finish (see Japanese Patent Laid-open No. 2000-94221, for example). This wire saw is configured in such a manner that a single wire such as a piano wire having a diameter of about 100 to 300 µm is wound around many grooves formed on usually two to four guide rollers to form a plurality of cutting portions spaced in parallel with a given pitch. The wire is operated to run in one direction or opposite directions, thereby slicing the ingot into a plurality of wafers.

However, when the ingot is cut by the wire saw and both sides of each wafer are polished to obtain the product, 70 to 80% of the ingot is discarded to cause a problem of poor economy. In particular, a hexagonal single crystal ingot of SiC or GaN, for example, has high Mohs hardness and it is therefore difficult to cut this ingot with the wire saw. Accordingly, considerable time is required for cutting of the ingot, causing a reduction in productivity. That is, there is a problem in efficiently producing a wafer in this prior art.

A technique for solving this problem is described in Japanese Patent Laid-open No. 2013-49161. This technique includes the steps of setting the focal point of a laser beam having a transmission wavelength to SiC inside a hexagonal single crystal ingot, next applying the laser beam to the ingot as scanning the laser beam on the ingot to thereby form a modified layer and cracks in a separation plane inside the ingot, and next applying an external force to the ingot to thereby break the ingot along the separation plane where the modified layer and the cracks are formed, thus separating a wafer from the ingot. In this technique, the laser beam is scanned spirally or linearly along the separation plane so that a first application point of the laser beam and a second application point of the laser beam nearest to the first application point have a predetermined positional relation with each other. As a result, the modified layer and the cracks are formed at very high density in the separation plane of the ingot.

SUMMARY OF THE INVENTION

However, in the ingot cutting method described in Japanese Patent Laid-open No. 2013-49461 mentioned above, the laser beam is scanned spirally or linearly on the ingot. In the case of linearly scanning the laser beam, the direction of scanning of the laser beam is not specified. In the ingot cutting method described in Japanese Patent Laid-No. 2013-49161, the pitch (spacing) between the first application point and the second application point of the laser beam as mentioned above is set to 1 to 10 µm. This pitch corresponds to the pitch of the cracks extending from the modified layer along a c-plane defined in the ingot.

In this manner, the pitch of the application points of the laser beam to be applied to the ingot is very small. Accordingly, regardless of whether the laser beam is scanned spirally or linearly, the laser beam must be applied with a very small pitch and the improvement in productivity is not yet sufficient.

Further, if undulation is present on the end surface of the ingot, the modified layers are formed in the separation plane as following the undulation. As a result, the wafer having the undulation on both sides (front side and back side) thereof is produced. Accordingly, the undulation must be removed from both sides of the wafer by polishing. Thus, the wafer cannot be produced from the ingot substantially efficiently, and the amount of the ingot to be discarded cannot be reduced.

It is therefore an object of the present invention to provide a wafer producing method which can efficiently produce a wafer from an ingot.

In accordance with an aspect of the present invention, there is provided a wafer producing method for producing a wafer from an ingot having an end surface. The wafer producing method includes an end surface measuring step of measuring undulation present on the end surface of the ingot; a separation plane forming step of setting a focal point of a laser beam having a transmission wavelength to the ingot inside the ingot at a predetermined depth from the end surface, which depth corresponds to a thickness of the wafer to be produced, after performing the end surface measuring step, and next applying the laser beam to the end surface of the ingot as relatively moving the focal point and the ingot to thereby form a separation plane containing a modified layer and cracks extending from the modified layer; and a wafer separating step of separating a platelike member having a thickness corresponding to the thickness of the wafer from the ingot at the separation plane after performing the separation plane forming step, thus producing the wafer from the ingot. In the separation plane forming step, a height of an objective lens for forming the focal point of the laser beam is controlled so that the focal point is set in the same plane to form the separation plane, according to a numerical aperture NA of the objective lens, a refractive index N of the ingot, and the undulation present on the end surface of the ingot as measured in the end surface measuring step.

Preferably, the height of the objective lens is controlled so that the objective lens is positioned at a height expressed as H=L−h(tan α/tan β), where L is a focal length of the objective lens, h is a distance from the end surface of the ingot to the separation plane, H is a distance between the objective lens and the end surface of the ingot, the numeral aperture NA of the objective lens is expressed as sin β, and the refractive index N of the ingot is expressed as sin β/sin α, where α is an angle of refraction and β is an angle of incidence, or an aperture angle of the objective lens.

In accordance with another aspect of the present invention, there is provided a wafer producing method for producing a hexagonal single crystal wafer from a hexagonal single crystal ingot having a first surface, a second surface opposite to the first surface, a c-axis extending from the first surface to the second surface, and a c-plane perpendicular to the c-axis. The wafer producing method includes an end surface measuring step of measuring undulation present on the first surface of the ingot as an end surface of the ingot; a separation plane forming step of setting a focal point of a laser beam having a transmission wavelength to the ingot inside the ingot at a predetermined depth from the first surface, which depth corresponds to a thickness of the wafer to be produced, after performing the end surface measuring step, and next applying the laser beam to the first surface as relatively moving the focal point and the ingot to thereby form a separation plane containing a modified layer parallel to the first surface and cracks extending from the modified layer along the c-plane; and a wafer separating step of separating a platelike member having a thickness corresponding to the thickness of the wafer from the ingot at the separation plane after performing the separation plane forming step, thus producing the wafer from the ingot. The separation plane forming step includes a modified layer forming step of relatively moving the focal point of the laser beam in a first direction perpendicular to a second direction where the c-axis is inclined by an off angle with respect to a normal to the first surface and the off angle is formed between the first surface and the c-plane, thereby linearly forming the modified layer extending in the first direction; and an indexing step of relatively moving the focal point in the second direction to thereby index the focal point by a predetermined amount. In the separation plane forming step, a height of an objective lens for forming the focal point of the laser beam is controlled so that the focal point is set in the same plane to form the separation plane, according to a numerical aperture NA of the objective lens, a refractive index N of the ingot, and the undulation present on the first surface of the ingot as measured in the end surface measuring step.

According to the wafer producing method of the present invention, the end surface measuring step of measuring the undulation present on the end surface of the ingot is performed before performing the separation plane forming step. In the separation plane forming step, the height of the objective lens for forming the focal point of the laser beam is controlled so that the focal point is set in the same plane to form the separation plane, according to the numerical aperture NA of the objective lens, the refractive index N of the ingot, and the undulation present on the end surface of the ingot as measured in the end surface measuring step. Accordingly, even when the undulation is present on the end surface of the ingot, the flat separation plane can be formed inside the ingot without being affected by the undulation, so that the wafer can be efficiently produced from the ingot and the amount of the ingot to be discarded can be reduced.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram of a laser beam generating unit;
FIG. 6 is a schematic sectional view for illustrating a modified layer forming step;
FIG. 11 is a map showing the heights of the end surface of an ingot as measured in the end surface measuring step.

DETAILED DESCRIPTION OF THE PREFERRED EMBODIMENT

Figure 1:
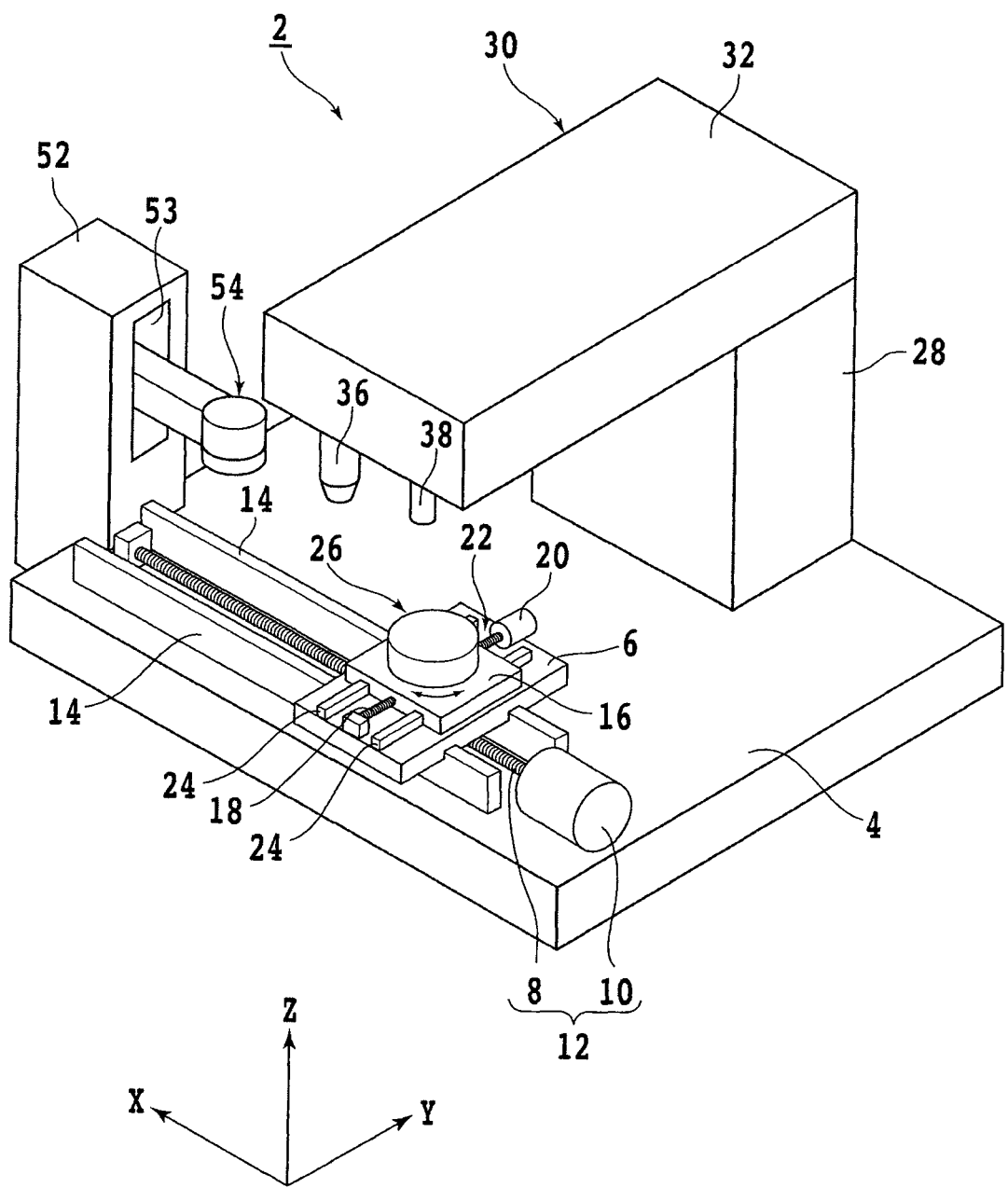
FIG. 1 is a perspective view of a laser processing apparatus suitable for use in performing a wafer producing method of the present invention.

A preferred embodiment of the present invention will now be described in detail with reference to the drawings. Referring to FIG. 1, there is shown a perspective view of a laser processing apparatus 2 suitable for use in performing a wafer producing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

As shown in FIG. 2, the laser beam generating unit 34 includes a laser oscillator 40 for generating a pulsed laser beam such as YAG laser and YVO4 laser, repetition frequency setting means 42 for setting the repetition frequency of the pulsed laser beam to be generated from the laser oscillator 40, pulse width adjusting means 44 for adjusting the pulse width of the pulsed laser beam to be generated from the laser oscillator 40, and power adjusting means 46 for adjusting the power of the pulsed laser generated from the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside a hexagonal single crystal ingot 11 as a workpiece fixed to the support table 26.

Figure 3A:
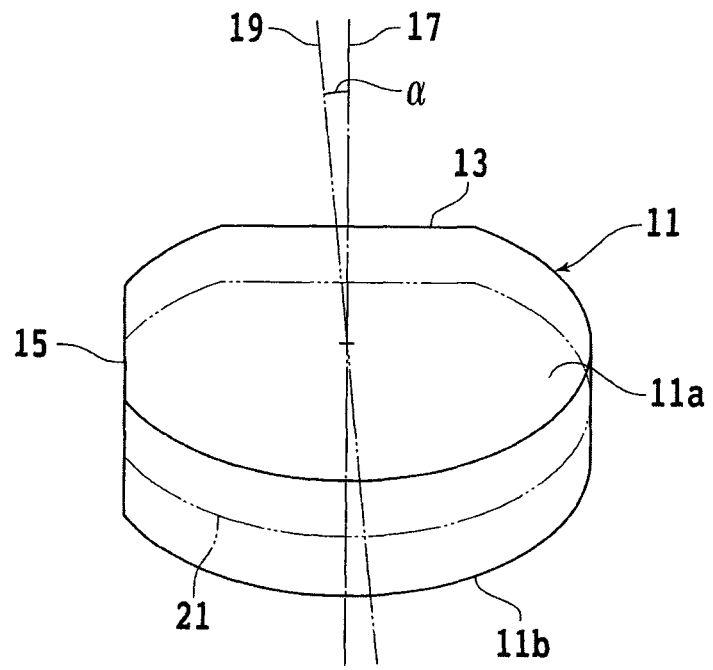
FIG. 3A is a perspective view of a hexagonal single crystal ingot.
Figure 3B:
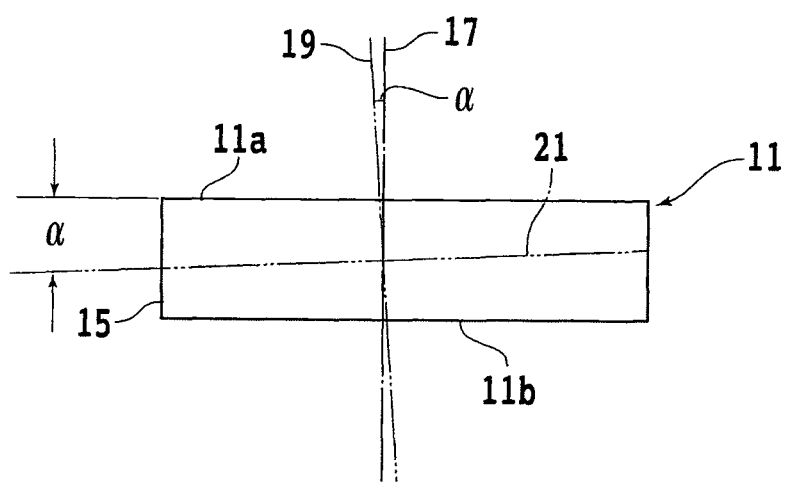
FIG. 3B is an elevational view of the ingot shown in FIG. 3A.

Referring to FIG. 3A, there is shown a perspective view of the hexagonal single crystal ingot 11 as a workpiece to be processed. FIG. 3B is an elevational view of the hexagonal single crystal ingot 11 shown in FIG. 3A. The hexagonal single crystal ingot (which will be hereinafter referred to also simply as ingot) 11 is selected from a SiC single crystal ingot or a GaN single crystal ingot. The ingot 11 has a first surface (upper surface) 11a and a second surface (lower surface) 11b opposite to the first surface 11a. The first surface 11a of the ingot 11 is preliminarily polished to a mirror finish because the laser beam is applied to the first surface 11a.

The ingot 11 has a first orientation flat 13 and a second orientation flat 15 perpendicular to the first orientation flat 13. The length of the first orientation flat 13 is set greater than the length of the second orientation flat 15. The ingot 11 has a c-axis 19 inclined by an off angle α toward the second orientation flat 15 with respect to a normal 17 to the upper surface 11a and also has a c-plane 21 perpendicular to the c-axis 19. The c-plane 21 is inclined by the off angle α with respect to the upper surface 11a. In general, in the hexagonal single crystal ingot 11, the direction perpendicular to the direction of extension of the shorter second orientation flat 15 is the direction of inclination of the c-axis 19. The c-plane 21 is set in the ingot 11 innumerably at the molecular level of the ingot 11. In this preferred embodiment, the off angle α is set to 4°. However, the off angle α is not limited to 4° in the present invention. For example, the off angle α may be freely set in the range of 1° to 6° in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
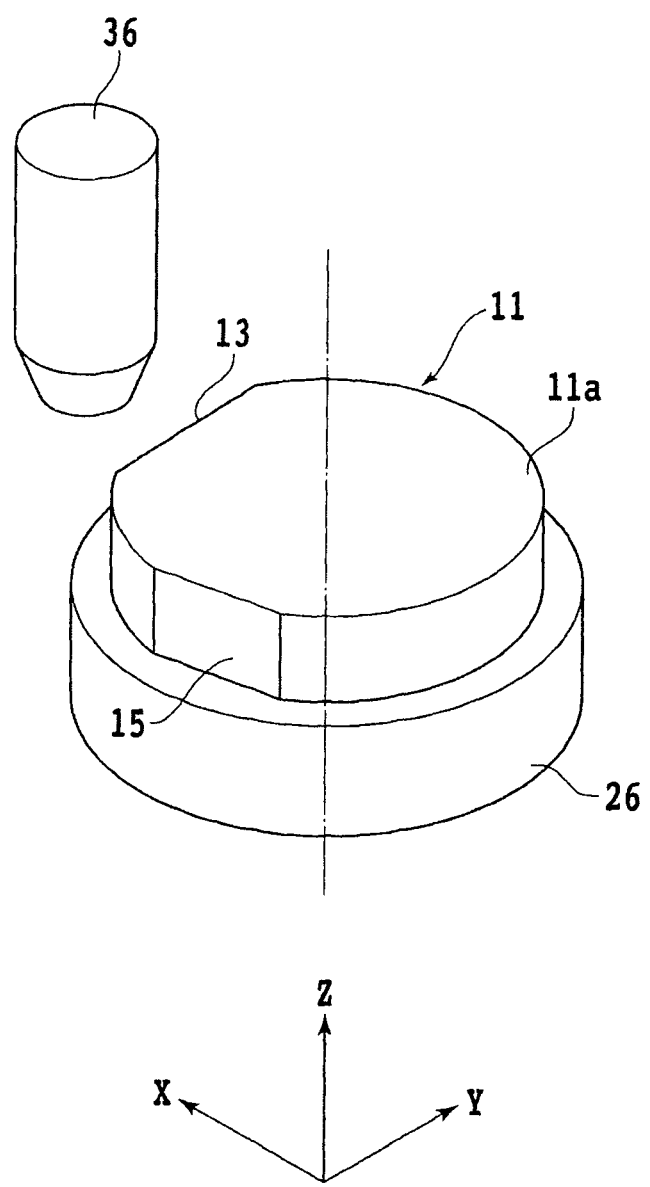
FIG. 4 is a perspective view for illustrating a separation start point forming step.
Figure 5:
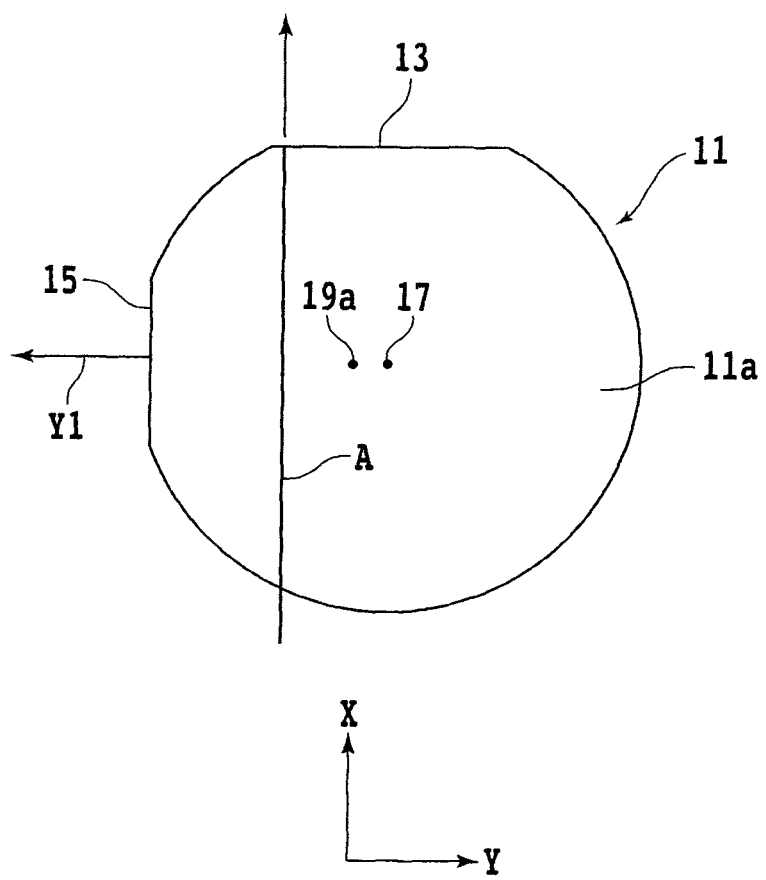
FIG. 5 is a plan view of the ingot shown in FIG. 3A.

As shown in FIG. 4, the ingot 11 is fixed to the upper surface of the support table 26 by using a wax or adhesive in the condition where the second orientation flat 15 of the ingot 11 becomes parallel to the X direction. In other words, as shown in FIG. 5, the direction of formation of the off angle α is shown by an arrow Y1. That is, the direction of the arrow Y1 is the direction where the intersection 19a between the c-axis 19 and the upper surface 11a of the ingot 11 is present with respect to the normal 17 to the upper surface 11a. Further, the direction perpendicular to the direction of the arrow Y1 is shown by an arrow A. Then, the ingot 11 is fixed to the support table 26 in the condition where the direction of the arrow A becomes parallel to the X direction.

Accordingly, the laser beam is scanned in the direction of the arrow A perpendicular to the direction of the arrow Y1, or the direction of formation of the off angle α. In other words, the direction of the arrow A perpendicular to the direction of the arrow Y1 where the off angle α is formed is defined as the feeding direction of the support table 26.

In the wafer producing method of the present invention, it is important that the scanning direction of the laser beam to be applied from the focusing means 36 is set to the direction of the arrow A perpendicular to the direction of the arrow Y1 where the off angle α of the ingot 11 is formed. That is, it was found that by setting the scanning direction of the laser beam to the direction of the arrow A as mentioned above in the wafer producing method of the present invention, cracks propagating from a modified layer formed inside the ingot 11 by the laser beam extend very long along the c-plane 21.

In performing the wafer producing method according to this preferred embodiment, a separation start point forming step is performed in such a manner that the focal point of the laser beam having a transmission wavelength (e.g., 1064 nm) to the hexagonal single crystal ingot 11 fixed to the support table 26 is set inside the ingot 11 at a predetermined depth from the first surface (upper surface) 11a, which depth corresponds to the thickness of a wafer to be produced, and the laser beam is next applied to the upper surface 11a as relatively moving the focal point and the ingot 11 to thereby form a modified layer 23 parallel to the upper surface 11a and cracks 25 propagating from the modified layer 23 along the c-plane 21, thus forming a separation start point (separation plane) where the modified layer 23 and the cracks 25 are formed.

Figure 7:
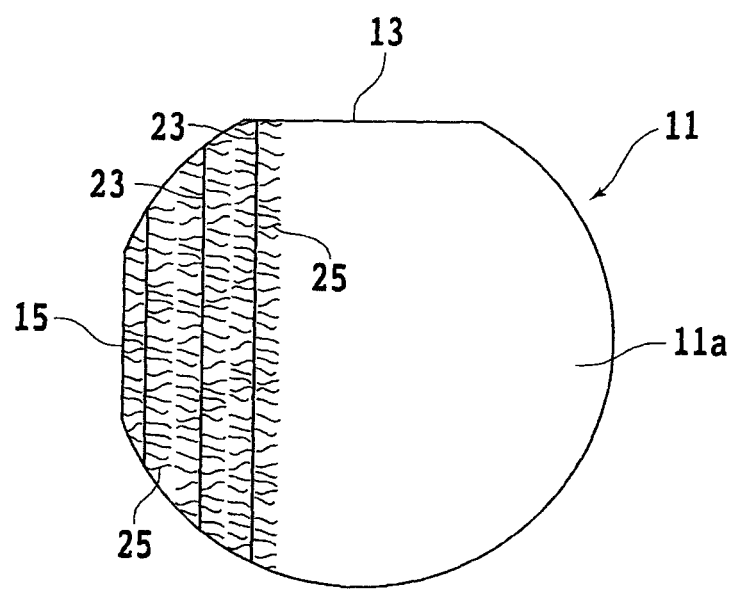
FIG. 7 is a schematic plan view for illustrating the modified layer forming step.
Figure 8A:
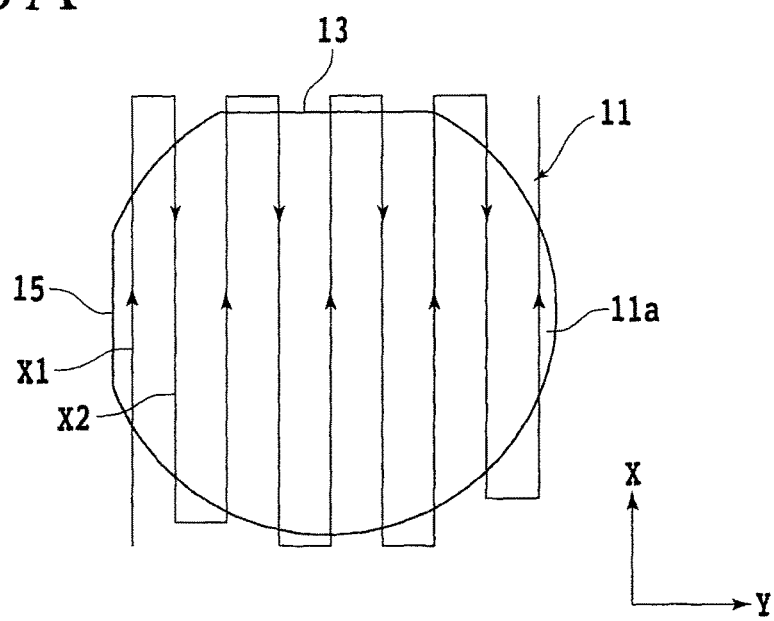
FIG. 8A is a schematic plan view for illustrating an indexing step.
Figure 8B:
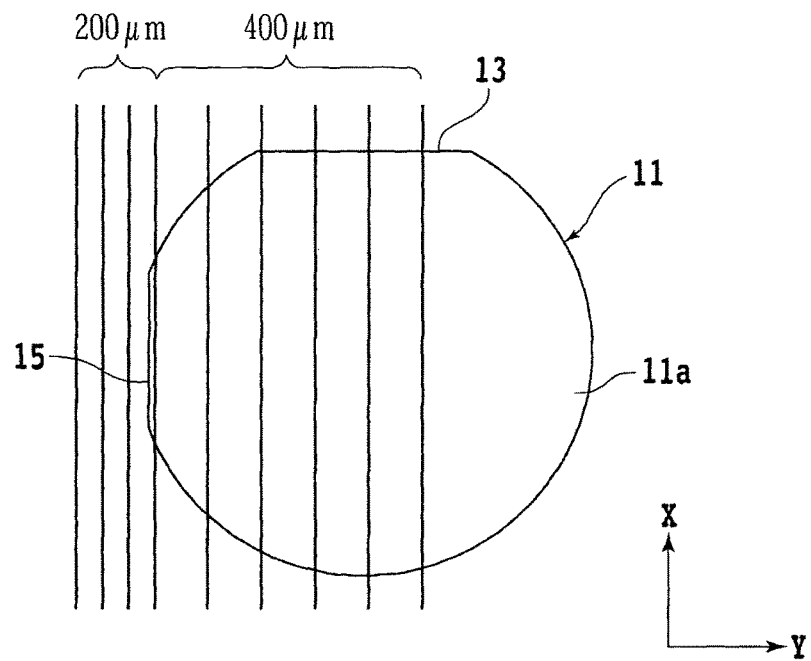
FIG. 8B is a schematic plan view for illustrating an index amount.

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the upper surface 11a and the off angle α is formed between the c-plane 21 and the upper surface 11a, thereby forming the modified layer 23 inside the ingot 11 and the cracks 25 propagating from the modified layer 23 along the c-plane 21, and also includes an indexing step of relatively moving the focal point in the direction of formation of the off angle α, i.e., in the Y direction to thereby index the focal point by a predetermined amount as shown in FIG. 7 and FIGS. 8A and 8B.

As shown in FIGS. 6 and 7, the modified layer 23 is linearly formed so as to extend in the X direction, so that the cracks 25 propagate from the modified layer 23 in opposite directions along the c-plane 21. In the wafer producing method according to this preferred embodiment, the separation start point forming step further includes an index amount setting step of measuring the width of the cracks 25 formed on one side of the modified layer 23 along the c-plane 21 and then setting the index amount of the focal point according to the width measured above. More specifically, letting W1 denote the width of the cracks 25 formed on one side of the modified layer 23 so as to propagate from the modified layer 23 along the c-plane 21, the index amount W2 of the focal point is set in the range of W1 to 2W1.

For example, the separation start point forming step is performed under the following laser processing conditions.

Light source: Nd:YAG pulsed laser
Wavelength: 1064 nm

Repetition frequency: 80 kHz
Average power: 3.2 W
Pulse width: 4 ns
Spot diameter: 10 μm
Numerical aperture (NA) of the focusing lens: 0.45
Index amount: 400 μm In the laser processing conditions mentioned above, the width W1 of the cracks 25 propagating from the modified layer 23 along the c-plane 21 in one direction as viewed in FIG. 6 is set to about 250 μm, and the index amount W2 is set to 400 μm. However, the average power of the laser beam is not limited to 3.2 W. When the average power of the laser beam was set to 2 to 4.5 W, good results were obtained in the preferred embodiment. In the case that the average power was set to 2 W, the width W1 of the cracks 25 was about 100 μm. In the case that the average power was set to 4.5 W, the width W1 of the cracks 25 was about 350 μm.

In the case that the average power is less than 2 W or greater than 4.5 W, the modified layer 23 cannot be well formed inside the ingot 11. Accordingly, the average power of the laser beam to be applied is preferably set in the range of 2 to 4.5 W. For example, the average power of the laser beam to be applied to the ingot 11 was set to 3.2 W in this preferred embodiment. As shown in FIG. 6, the depth D1 of the focal point from the upper surface 11a in forming the modified layer 23 was set to 500 μm.

Referring to FIG. 8A, there is shown a schematic plan view for illustrating the scanning direction of the laser beam. The separation start point forming step is performed on a forward path X1 and a backward path X2 as shown in FIG. 8A. That is, the modified layer 23 is formed in the hexagonal single crystal ingot 11 on the forward path X1. Thereafter, the focal point of the laser beam is indexed by the predetermined amount. Thereafter, the modified layer 23 is formed again in the ingot 11 on the backward path X2.

Further, in the case that the index amount of the focal point of the laser beam is set in the range of W to 2W where W is the width of the cracks 25 formed on one side of the modified layer 23 along the c-plane 21, the index amount of the focal point is preferably set to W or less until the modified layer 23 is first formed after setting the focal point of the laser beam inside the ingot 11.

For example, in the case that the index amount of the focal point of the laser beam is 400 μm, the index amount is set to 200 μm until the modified layer 23 is first formed inside the ingot 11, and the laser beam is scanned plural times with this index amount of 200 μm as shown in FIG. 8B. That is, a first part of the plural scanning paths of the laser beam is idle, and when it is determined that the modified layer 23 has been first formed inside the ingot 11, the index amount is set to 400 μm and the modified layer 23 is then formed inside the ingot 11.

There will now be described an end surface measuring step of measuring undulation present on the first surface (end surface or upper surface) 11a of the ingot 11, with reference to FIGS. 9 to 13. If undulation is present on the end surface 11a of the ingot 11, the modified layers 23 are formed in the separation plane as following the undulation. As a result, when the wafer separating step is next performed to separate the wafer from the ingot, the wafer having the undulation on both sides (front side and back side) thereof is produced. Accordingly, the undulation must be removed from both sides of the wafer by polishing. Thus, the wafer cannot be produced from the ingot substantially efficiently.

Figure 9:
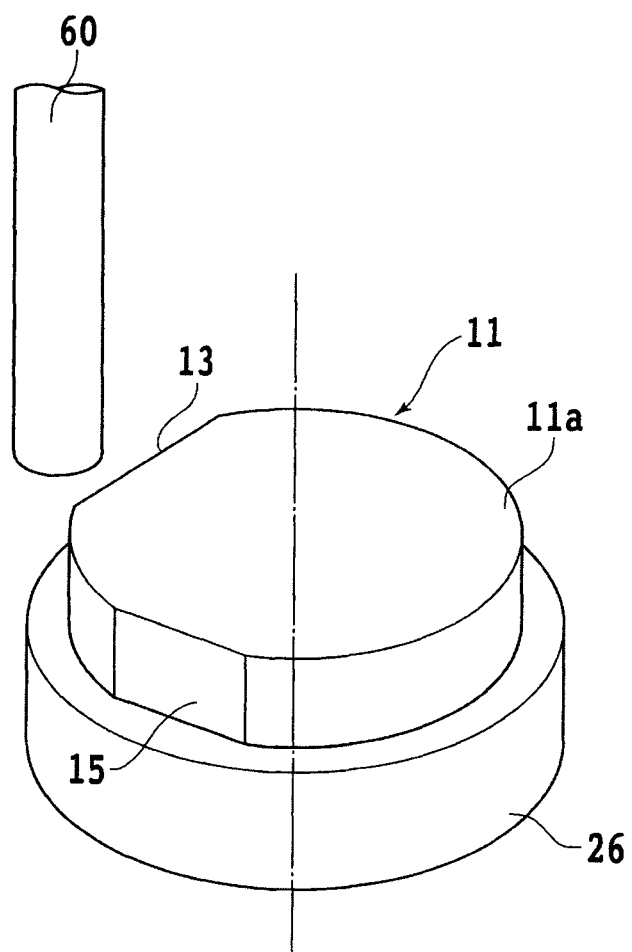
FIG. 9 is a perspective view showing an end surface measuring step.

To solve this problem, the wafer producing method of the present invention includes an end surface measuring step of measuring the undulation present on the end surface 11a of the ingot 11 before performing a separation plane forming step (separation start point forming step). As shown in FIG. 9, this end surface measuring step is performed by using an end surface measuring apparatus 60 for measuring the height of the end surface 11a of the ingot 11 as moving the ingot 11 supported to the support table 26 in the X direction and the Y direction.

Figure 10:
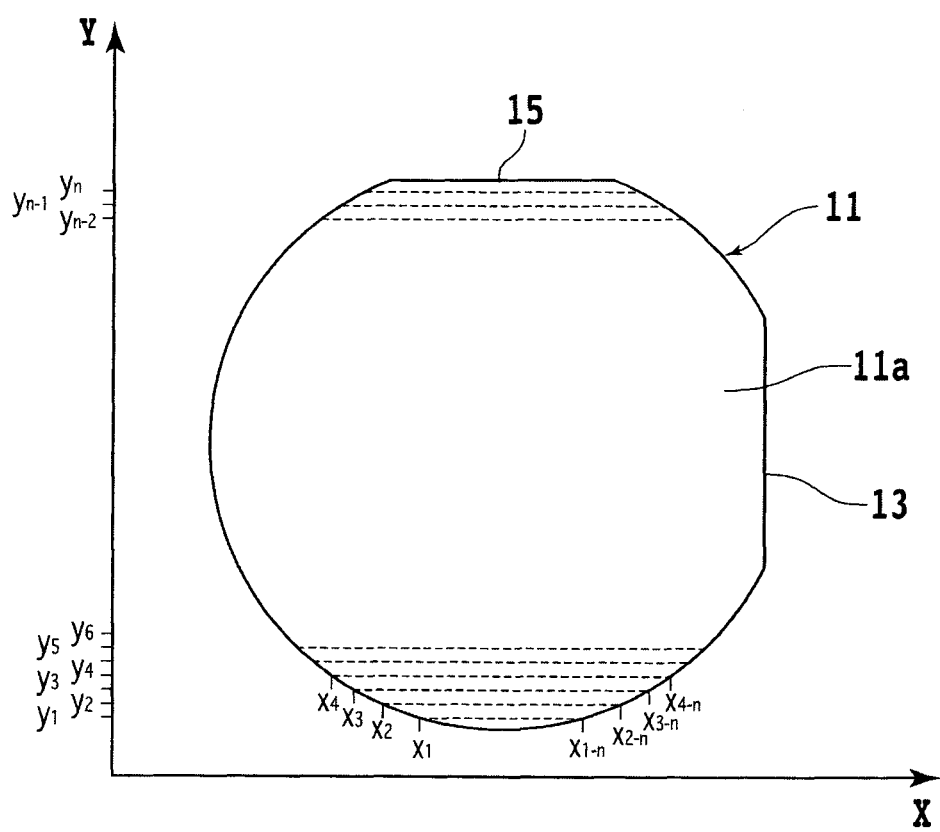
FIG. 10 is a schematic plan view for illustrating the end surface measuring step.

As the end surface measuring apparatus 60, a laser type or ultrasonic type height detecting apparatus known in the art may be used. As shown in FIG. 10, the coordinate (x1, y1) of the end surface 11a of the ingot 11 supported to the support table 26 is moved to a position directly below the end surface measuring apparatus 60. Thereafter, the support table 26 is moved in the X direction to continuously measure the height z1 of the end surface 11a at the coordinate (x1, y1), the height z1-1 of the end surface 11a at the coordinate (x1-1, y1), the height z1-2 of the end surface 11a at the coordinate (x1-2, y1), . . . , and the height z1-n of the end surface 11a at the coordinate (x1-n, y1). These heights z1 to z1-n measured above are then stored into a memory of control means (controller) 62 shown in FIG. 12.

Thereafter, the support table 26 is indexed in the Y direction to similarly measure the heights z2 to z2-n of the end surface 11a at the coordinates (x2, y2) to (x2-n, y2) as moving the support table 26 in the X direction. These heights z2 to z2-n measured above are then stored into the memory of the control means 62. Similarly, the support table 26 is indexed from the position y1 to the position ym to create a map as shown in FIG. 11. This map is then stored into the memory of the control means 62. As a result, the undulation (variations in height) of the end surface 11a of the ingot 11 can be measured over the whole of the end surface 11a.

Figure 12:
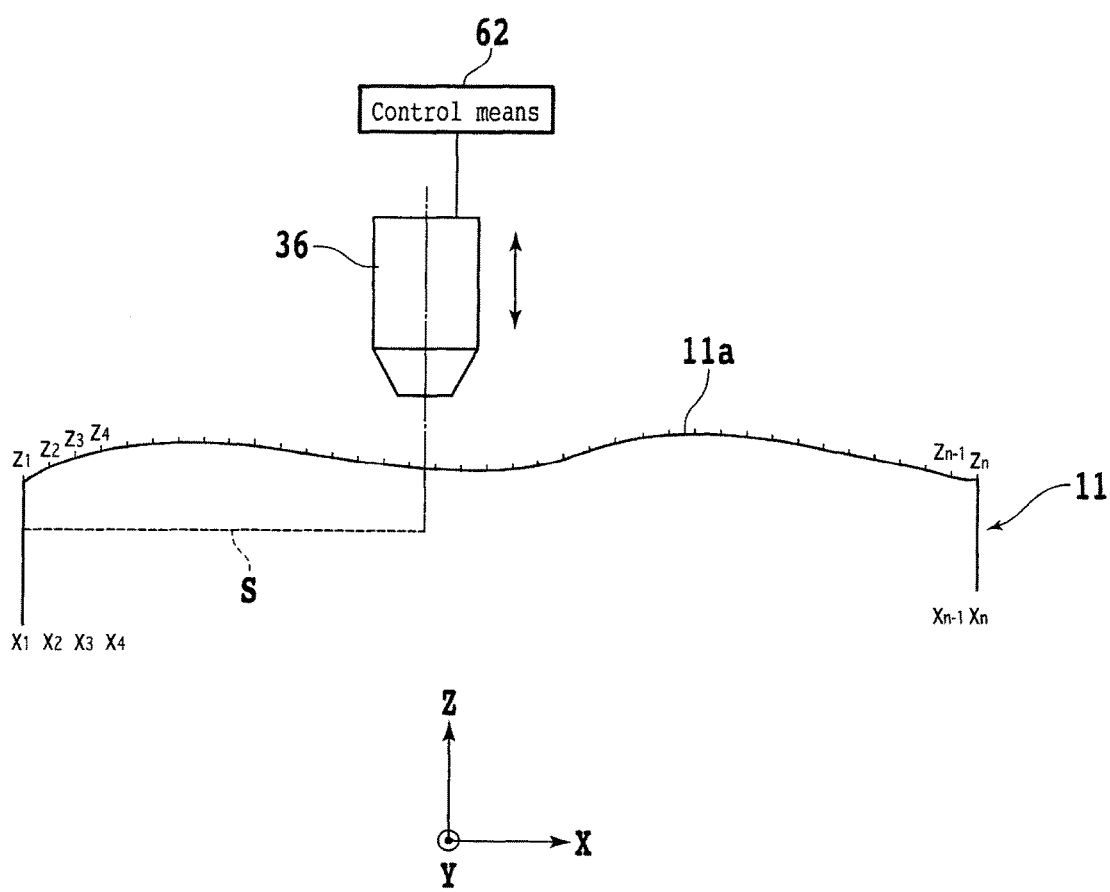
FIG. 12 is a schematic side view showing a separation plane forming step.

After performing the end surface measuring step, a separation plane forming step is performed as shown in FIG. 12 in such a manner that the focal point of a laser beam having a transmission wavelength to the ingot 11 is set inside the ingot 11 at a predetermined depth from the end surface 11a, which depth corresponds to the thickness of the wafer to be produced, and the laser beam is next applied to the end surface 11a as relatively moving the focal point and the ingot 11 to thereby form a separation plane S containing the modified layer 23 and the cracks 25 inside the ingot 11.

In this separation plane forming step, the height of the focusing means 36 is controlled by the control means 62 so that the focal point (convergent point) of the laser beam is set in the same plane to form the separation plane S, according to the numerical aperture NA of the objective lens (focusing lens) 50 for forming the focal point of the laser beam, the refractive index N of the ingot 11, and the undulation present on the end surface 11a of the ingot 11 as measured in the end surface measuring step.

Figure 13:
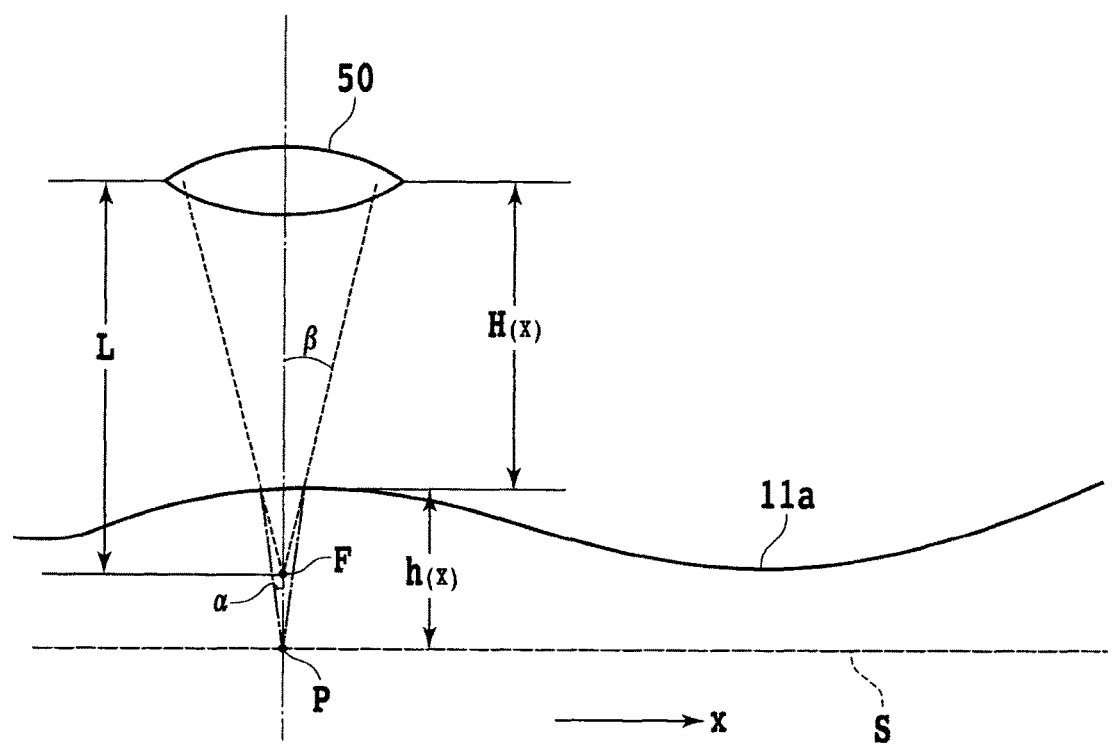
FIG. 13 is an enlarged schematic view for illustrating a control method of controlling the height of an objective lens for forming the focal point of a laser beam so that the focal point is formed in the same plane to form a flat separation plane in the separation plane forming step.

This control method will now be described in detail with reference to FIG. 13. Letting L denote the focal length of the objective lens 50, h(x) denote the distance from the end surface 11a of the ingot 11 to the separation plane S, and H(x) denote the distance between the objective lens 50 and the end surface 11a of the ingot 11, the following equation is given because the numerical aperture NA of the objective lens 50 is expressed as $\sin \beta$ and the refractive index N of the ingot 11 is expressed as $\sin \beta / \sin \beta$, where $\alpha$ is the angle of refraction and $\beta$ is the angle of incidence, or the aperture angle of the objective lens 50.

$$(L-H(x))\tan \beta = h(x)\tan \alpha$$

Accordingly, the following equations are given.

$$H(x)\tan \beta = L \tan \beta - h(x)\tan \alpha$$

$$H(x) = L - h(x)(\tan \alpha / \tan \beta)$$

That is, the height of the focusing means 36 is controlled so that the objective lens 50 of the focusing means 36 is positioned at the height expressed as H(x)=L−h(x) (tan α/tan β).

Figure 15:
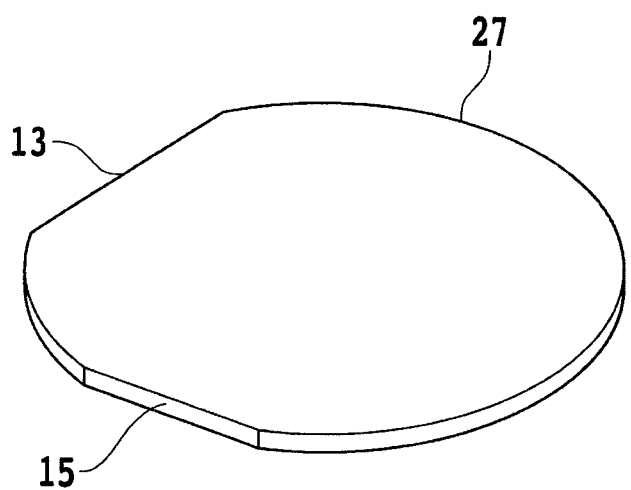
FIG. 15 is a perspective view of a hexagonal single crystal wafer produced from the ingot.

In this manner, the height of the focusing means 36 is controlled to form a plurality of modified layers 23 at the position of the separation plane S in the whole area of the ingot 11 and the cracks 25 extending from each modified layer 23 along the c-plane 21. Thereafter, a wafer separating step is performed in such a manner that an external force is applied to the ingot 11 to thereby separate a platelike member having a thickness corresponding to the thickness of the wafer from the ingot 11 at the separation plane S containing the modified layers 23 and the cracks 25, thus producing a hexagonal single crystal wafer 27 shown in FIG. 15.

Figure 14A:
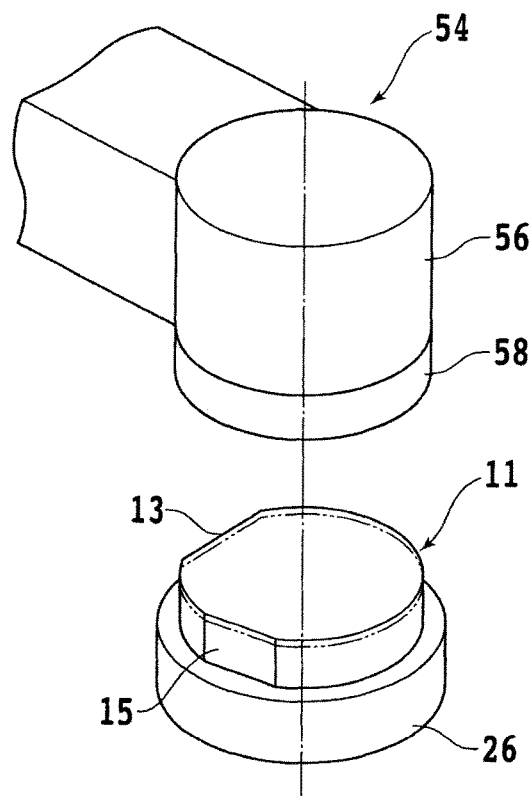
FIGS. 14A and 14B are perspective views for illustrating a wafer separating step.
Figure 14B:
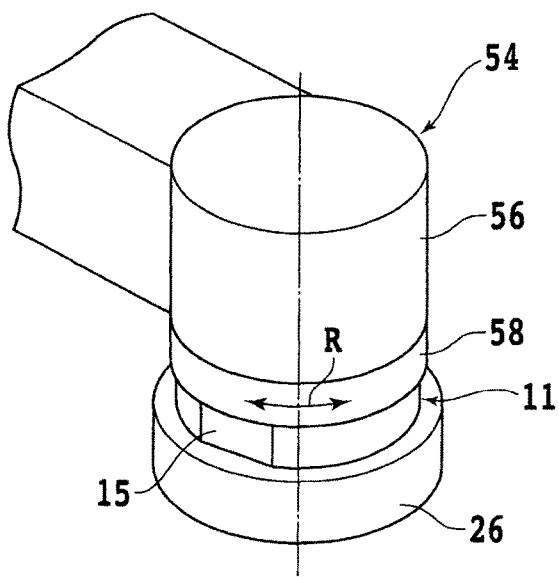

This wafer separating step is performed by using the pressing mechanism 54 shown in FIG. 1. The configuration of the pressing mechanism 54 is shown in FIGS. 14A and 14B. The pressing mechanism 54 includes a head 56 vertically movable by a moving mechanism (not shown) incorporated in the column 52 shown in FIG. 1 and a pressing member 58 rotatable in the direction shown by an arrow R in FIG. 14B with respect to the head 56. As shown in FIG. 14A, the pressing mechanism 54 is relatively positioned above the ingot 11 fixed to the support table 26. Thereafter, as shown in FIG. 14B, the head 56 is lowered until the pressing member 58 comes into pressure contact with the upper surface (end surface) 11a of the ingot 11.

In the condition where the pressing member 58 is in pressure contact with the upper surface 11a of the ingot 11, the pressing member 58 is rotated in the direction of the arrow R to thereby generate a torsional stress in the ingot 11. As a result, the ingot 11 is broken at the separation start point (separation plane S) where the modified layers 23 and the cracks 25 are formed. Accordingly, the hexagonal single crystal wafer 27 shown in FIG. 15 can be separated from the hexagonal single crystal ingot 11. After separating the wafer 27 from the ingot 11, the separation surface of the wafer 27 and the separation surface of the ingot 11 are preferably polished to a mirror finish.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing a wafer from an ingot having an end surface, the wafer producing method comprising:
    an end surface measuring step of measuring undulation present on the end surface of the ingot;
    a separation plane forming step of setting a focal point of a laser beam having a transmission wavelength to the ingot inside the ingot at a predetermined depth from the end surface, which depth corresponds to a thickness of the wafer to be produced, after performing the end surface measuring step, and next applying the laser beam to the end surface of the ingot as relatively moving the focal point and the ingot to thereby form a separation plane containing a modified layer and cracks extending from the modified layer; and
    a wafer separating step of separating a member having a thickness corresponding to the thickness of the wafer from the ingot at the separation plane after performing the separation plane forming step, thus producing the wafer from the ingot;
    wherein in the separation plane forming step, a height of an objective lens for forming the focal point of the laser beam is controlled so that the focal point is set in the same plane to form the separation plane, based on a numerical aperture (NA) of the objective lens, a refractive index N of the ingot, and the undulation present on the end surface of the ingot as measured in the end surface measuring step.

2. The wafer producing method according to claim 1, wherein the height of the objective lens is controlled in the separation plane forming step so that the objective lens is positioned at a height expressed as H=L−h(tan α/tan β), where L is a focal length of the objective lens, h is a distance from the end surface of the ingot to the separation plane, H is a distance between the objective lens and the end surface of the ingot, the numeral aperture (NA) of the objective lens is expressed as sin β, and the refractive index N of the ingot is expressed as sin β/sin α, where α is an angle of refraction and β is an angle of incidence, or an aperture angle of the objective lens.

3. A wafer producing method for producing a hexagonal single crystal wafer from a hexagonal single crystal ingot having a first surface, a second surface opposite to the first surface, a c-axis extending from the first surface to the second surface, and a c-plane perpendicular to the c-axis, the wafer producing method comprising:
    an end surface measuring step of measuring undulation present on the first surface of the ingot as an end surface of the ingot;
    a separation plane forming step of setting a focal point of a laser beam having a transmission wavelength to the ingot inside the ingot at a predetermined depth from the first surface, which depth corresponds to a thickness of the wafer to be produced, after performing the end surface measuring step, and next applying the laser beam to the first surface as relatively moving the focal point and the ingot to thereby form a separation plane containing a modified layer parallel to the first surface and cracks extending from the modified layer along the c-plane; and
    a wafer separating step of separating a member having a thickness corresponding to the thickness of the wafer from the ingot at the separation plane after performing the separation plane forming step, thus producing the wafer from the ingot;
    the separation plane forming step including
        a modified layer forming step of relatively moving the focal point of the laser beam in a first direction perpendicular to a second direction where the c-axis is inclined by an off angle with respect to a normal to the first surface and the off angle is formed between the first surface and the c-plane, thereby linearly forming the modified layer extending in the first direction, and
        an indexing step of relatively moving the focal point in the second direction to thereby index the focal point by a predetermined amount;
    wherein in the separation plane forming step, a height of an objective lens for forming the focal point of the laser beam is controlled so that the focal point is set in the same plane to form the separation plane, based on a numerical aperture (NA) of the objective lens, a refractive index N of the ingot, and the undulation present on the first surface of the ingot as measured in the end surface measuring step.

\* \* \* \* \*